(12) United States Patent
Kobayashi

(10) Patent No.: US 12,313,495 B2
(45) Date of Patent: May 27, 2025

(54) STATE DETERMINATION DEVICE FOR HUB UNIT BEARING, STATE DETERMINATION METHOD FOR HUB UNIT BEARING, PROGRAM, AND HUB UNIT BEARING

(71) Applicant: NSK LTD., Tokyo (JP)

(72) Inventor: Daisuke Kobayashi, Fujisawa (JP)

(73) Assignee: NSK LTD., Tokyo (JP)

( * ) Notice: Subject to any disclaimer, the term of this patent is extended or adjusted under 35 U.S.C. 154(b) by 419 days.

(21) Appl. No.: 17/799,615

(22) PCT Filed: Jan. 29, 2021

(86) PCT No.: PCT/JP2021/003433
§ 371 (c)(1),
(2) Date: Aug. 12, 2022

(87) PCT Pub. No.: WO2021/161821
PCT Pub. Date: Aug. 19, 2021

(65) Prior Publication Data
US 2023/0067980 A1    Mar. 2, 2023

(30) Foreign Application Priority Data

Feb. 13, 2020 (JP) ................................. 2020-022733
Feb. 13, 2020 (JP) ................................. 2020-022734

(51) Int. Cl.
*G01M 13/04* (2019.01)
*B60B 27/00* (2006.01)
(Continued)

(52) U.S. Cl.
CPC ......... *G01M 13/04* (2013.01); *B60B 27/0068* (2013.01); *B60B 35/02* (2013.01); *G01R 33/02* (2013.01)

(58) Field of Classification Search
CPC ..... G01R 33/02; B60B 35/02; B60B 27/0068; B60B 27/0094; G01M 13/04
See application file for complete search history.

(56) References Cited

U.S. PATENT DOCUMENTS

2009/0038414 A1 * 2/2009 Ozaki ................. B60B 27/0005
73/862.381

FOREIGN PATENT DOCUMENTS

EP       3985384 A1    4/2022
JP    2006-98258 A    4/2006
(Continued)

OTHER PUBLICATIONS

International Search Report (PCT/ISA/210) issued Apr. 20, 2021 by the International Searching Authority in counterpart International Patent Application No. PCT/JP2021/003433.
(Continued)

*Primary Examiner* — Paul M. West
(74) *Attorney, Agent, or Firm* — Sughrue Mion, PLLC

(57) ABSTRACT

A state determination device for a hub unit bearing includes: a holding unit that holds reference information of magnetic characteristics at a predetermined position in the vicinity of a flange portion included in the hub unit bearing; an acquisition unit that acquires measurement information of the magnetic characteristics at the predetermined position of the hub unit bearing; a derivation unit that derives a change amount between the reference information held by the holding unit and the measurement information acquired by the acquisition unit; and a determination unit that determines a state of the hub unit bearing based on the change amount derived by the derivation unit. The predetermined position is a position at which the magnetic characteristics vary with a stress change with respect to the flange portion.

19 Claims, 11 Drawing Sheets

(51) Int. Cl.
*B60B 35/02* (2006.01)
*G01R 33/02* (2006.01)

(56) References Cited

FOREIGN PATENT DOCUMENTS

| | | |
|---|---|---|
| JP | 2007-163246 A | 6/2007 |
| JP | 4029777 B2 | 1/2008 |
| JP | 5673382 B2 | 2/2015 |
| JP | 2018-194433 A | 12/2018 |
| JP | 2020-24173 A | 2/2020 |

OTHER PUBLICATIONS

Written Opinion(PCT/ISA/237) issued Apr. 20, 2021 by the International Searching Authority in counterpart International Patent Application No. PCT/JP2021/003433.
Office Action issued Oct. 5, 2021 by the Japanese Patent Office in counterpart Japanese Patent Application No. 2021-531059.
Communication issued Nov. 6, 2024 by the European Patent Office for EP Patent Application No. 21754232.3.

\* cited by examiner

STATE DETERMINATION DEVICE FOR HUB UNIT BEARING, STATE DETERMINATION METHOD FOR HUB UNIT BEARING, PROGRAM, AND HUB UNIT BEARING

This application is a National Stage of International Application No. PCT/JP2021/003433 filed Jan. 29, 2021, claiming priority based on Japanese Patent Application No. 2020-022733, filed Feb. 13, 2020, and Japanese Patent Application No. 2020-022734, filed Feb. 13, 2020, the contents of all of which are incorporated herein by reference in their entirety.

TECHNICAL FIELD

The present invention relates to a state determination device that determines a state of a hub unit bearing that rotatably supports wheels and the like of an automobile, a state determination method, a program, and a hub unit bearing.

BACKGROUND ART

In the related art, in order to efficiently rotate an axle coupled to a wheel of an automobile, a hub unit bearing that rotatably supports the axle is known. The hub unit bearing has a flange portion and is constituted to be easily attached to a vehicle body or the wheel.

There is known a method of diagnosing a state of a hub unit bearing without disassembling the hub unit bearing itself when a regular inspection of the hub unit bearing is performed. For example, in Patent Literature 1, a vibration sensor installed on an outer ring of a hub unit bearing is used to acquire vibration when a rotation operation of the hub unit bearing is performed, and when a value obtained by calculating a vibration signal exceeds a set threshold value, the hub unit bearing is diagnosed as abnormal. Further, in the method of Patent Literature 1, when abnormality is diagnosed, an abnormal position is also specified.

Patent Literature 2 discloses that a strain amount of a rolling bearing unit is detected by using an inverse magnetostrictive effect generated by a compressive stress acting on a rolling element and an inner ring raceway surface, which is detected by using a magnetostrictive sensor.

CITATION LIST

Patent Literature

Patent Literature 1: Japanese Patent No. 5673382
Patent Literature 2: Japanese Patent No. 4029777

SUMMARY OF INVENTION

Technical Problem

However, the method in Patent Literature 1 is a method of detecting an abnormality caused by occurrence of damage, and the abnormality cannot be specified unless the damage occurs. The method in Patent Literature 1 is a determination method at the time of the regular inspection, and it is not assumed that a state of the hub unit bearing is constantly monitored. For example, it is not possible to easily determine a state at the time of normal use.

Further, in Patent Literature 2, since it is necessary to obtain the compressive stress acting on the rolling element and the inner ring raceway surface, it is necessary to separately perform processing for installing a sensor in the vicinity of the members on the hub unit bearing.

In view of the above problems, an object of the present invention is to provide a hub unit bearing capable of easily determining a state of the hub unit bearing, and to easily determine the state of the hub unit bearing.

Solution to Problem

In order to solve the above problems, the present invention has the following configurations. That is, a state determination device for a hub unit bearing includes: a holding unit that holds reference information of magnetic characteristics at a predetermined position in the vicinity of a flange portion included in the hub unit bearing; an acquisition unit that acquires measurement information of the magnetic characteristics at the predetermined position of the hub unit bearing; a derivation unit that derives a change amount between the reference information held by the holding unit and the measurement information acquired by the acquisition unit; and a determination unit that determines a state of the hub unit bearing based on the change amount derived by the derivation unit. The predetermined position is a position at which the magnetic characteristics vary with a stress change with respect to the flange portion.

Another embodiment of the present invention has the following configuration. That is, a state determination device for a hub unit bearing includes: an acquisition unit that acquires measurement information of the magnetic characteristics in the vicinity of the flange portion of the hub unit bearing during a predetermined rotation operation; a derivation unit that derives a difference between a maximum value and a minimum value in the measurement information acquired by the acquisition unit; and a determination unit that determines a state of the hub unit bearing based on the difference derived by the derivation unit. The predetermined position is a position at which the magnetic characteristics vary with the stress change with respect to the flange portion.

Another embodiment of the present invention has the following configuration. That is, a hub unit bearing includes: an outer ring having an outer ring raceway on an inner peripheral surface thereof; a hub having an inner ring raceway on an outer peripheral surface thereof, the inner ring raceway facing the outer ring raceway of the outer ring; and a plurality of rolling elements rollably provided between the outer ring raceway and the inner ring raceway. The hub unit bearing further includes: a magnetic sensor that detects magnetic characteristics in the vicinity of a flange portion provided in the hub unit bearing. A detection position detected by the magnetic sensor is a position at which the magnetic characteristics vary with the stress change with respect to the flange portion.

Advantageous Effects of Invention

According to the present invention, it is possible to provide a hub unit capable of easily determining a state of the hub unit bearing and to easily determine the state of the hub unit bearing.

DESCRIPTION OF EMBODIMENTS

Figure 1:
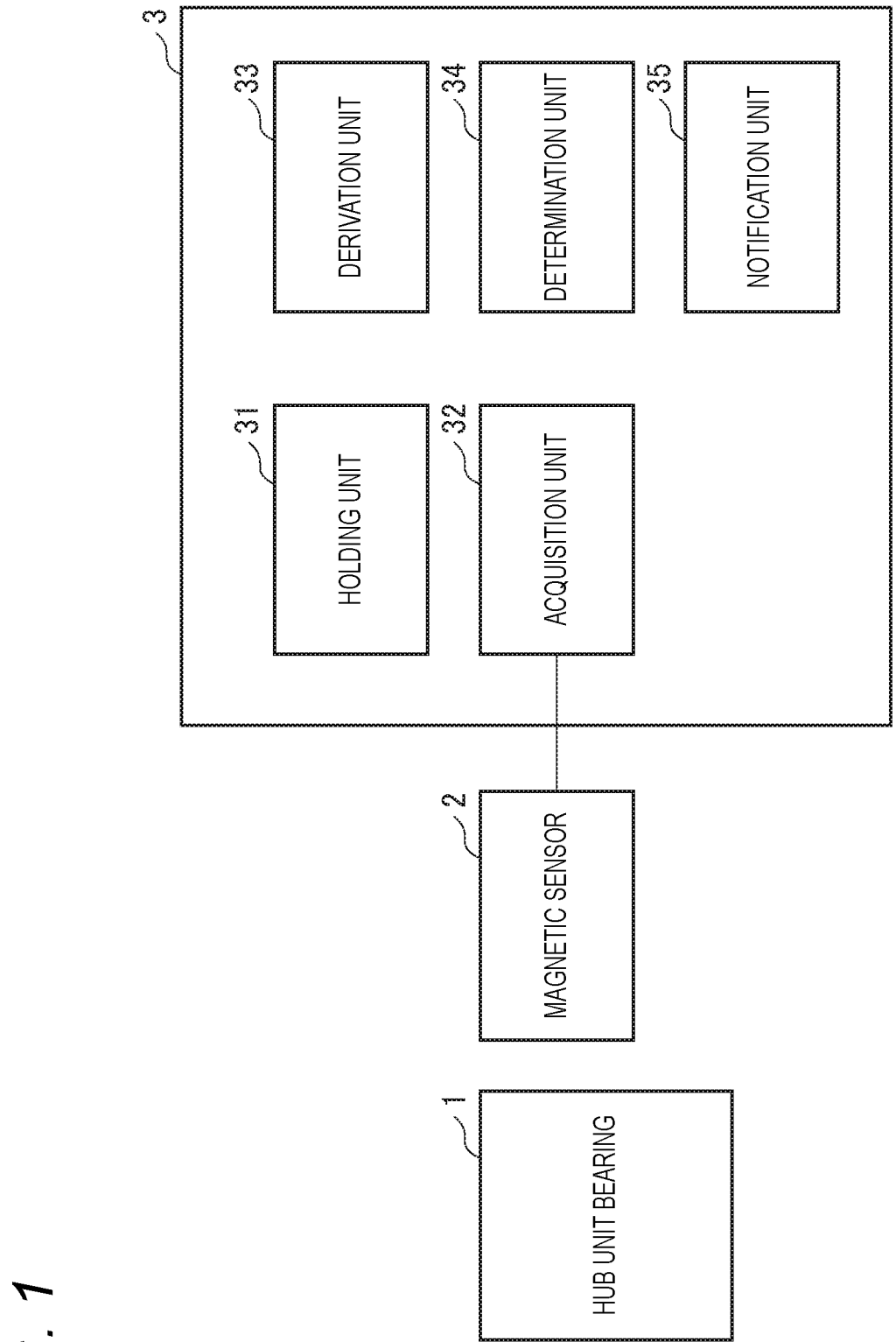
FIG. 1 is a diagram showing an example of an overall configuration of a device according to a first embodiment.

Hereinafter, embodiments of the present invention will be described with reference to the drawings. It should be noted that the embodiments described below are embodiments for illustrating the present invention, and are not intended to be construed as limiting the present invention, and all the configurations described in the respective embodiments are not necessarily essential configurations for solving the problem of the present invention. In the drawings, the same components are denoted by the same reference numerals to indicate the correspondence.

First Embodiment

Hereinafter, a first embodiment of the present invention will be described.

[Overall Configuration]

FIG. 1 is a diagram showing an example of an overall configuration of each device according to the present embodiment. FIG. 1 shows a hub unit bearing 1, a magnetic sensor 2, and a determination device 3.

In the present embodiment, when a state of the hub unit bearing 1 is determined, the magnetic sensor 2 is installed at a predetermined detection position of the hub unit bearing 1, and magnetic characteristics of the hub unit bearing 1 are detected by the magnetic sensor 2. In the present embodiment, the magnetic characteristics to be detected are magnetic flux densities. The magnetic sensor 2 will be described as being capable of detecting magnetic flux densities in three axial directions with respect to a predetermined origin. As the magnetic sensor 2 according to the present embodiment, for example, a magneto-impedancene (MI) sensor can be used. In the present embodiment, the detection position of the magnetic sensor 2 is in the vicinity of a flange portion of the hub unit bearing 1, and more specifically, is in a region of the radially outer end portion of an outer ring in the vicinity of the flange portion. The detection position described here is an example, and may be another position as long as the position is a position where a change in the magnetic characteristics appears due to stress applied to the flange portion due to use.

The determination device 3 according to the present embodiment includes a holding unit 31, an acquisition unit 32, a derivation unit 33, a determination unit 34, and a notification unit 35. The holding unit 31 holds various kinds of information used in derivation processing performed by the derivation unit 33 and determination processing performed by the determination unit 34, which will be described later. The holding unit 31 may be implemented by a non-volatile storage region (a read only memory (ROM), a hard disk drive (HDD), or the like) included in the determination device 3.

The acquisition unit 32 acquires information on the magnetic characteristics detected by the magnetic sensor 2. The derivation unit 33 derives information on the change in the magnetic characteristics using the information held by the holding unit 31 and the information on the magnetic characteristics acquired by the acquisition unit 32. The determination unit 34 determines the state of the hub unit bearing 1 based on the information derived by the derivation unit 33.

The notification unit 35 notifies the outside of a result determined by the determination unit 34. The notification unit 35 may be constituted to display a determination result on a display unit such as a liquid crystal display (LCD), or may be constituted as a transmission unit that transmits the determination result to an external device.

The determination device 3 may be implemented by, for example, an information processing device such as a personal computer (PC), an in-vehicle processing unit (electronic control unit (ECU)), or the like. Although FIG. 1 shows a configuration in which the magnetic sensor 2 is provided outside the determination device 3, the magnetic sensor 2 and the determination device 3 may be integrated.

The magnetic sensor 2 may be constituted to be installed in advance at a predetermined detection position of the hub unit bearing 1. In this case, the determination device 3 may acquire the detection result from the magnetic sensor 2 using wired or wireless communication or the like. A detection timing of the magnetic characteristics by the magnetic sensor 2 may be constituted such that the magnetic sensor 2 periodically detects the magnetic characteristics and transmits the detection result to the determination device 3, or may be constituted such that the detection is performed based on an instruction from the determination device 3.

[Hub Unit Bearing]

Figure 2:
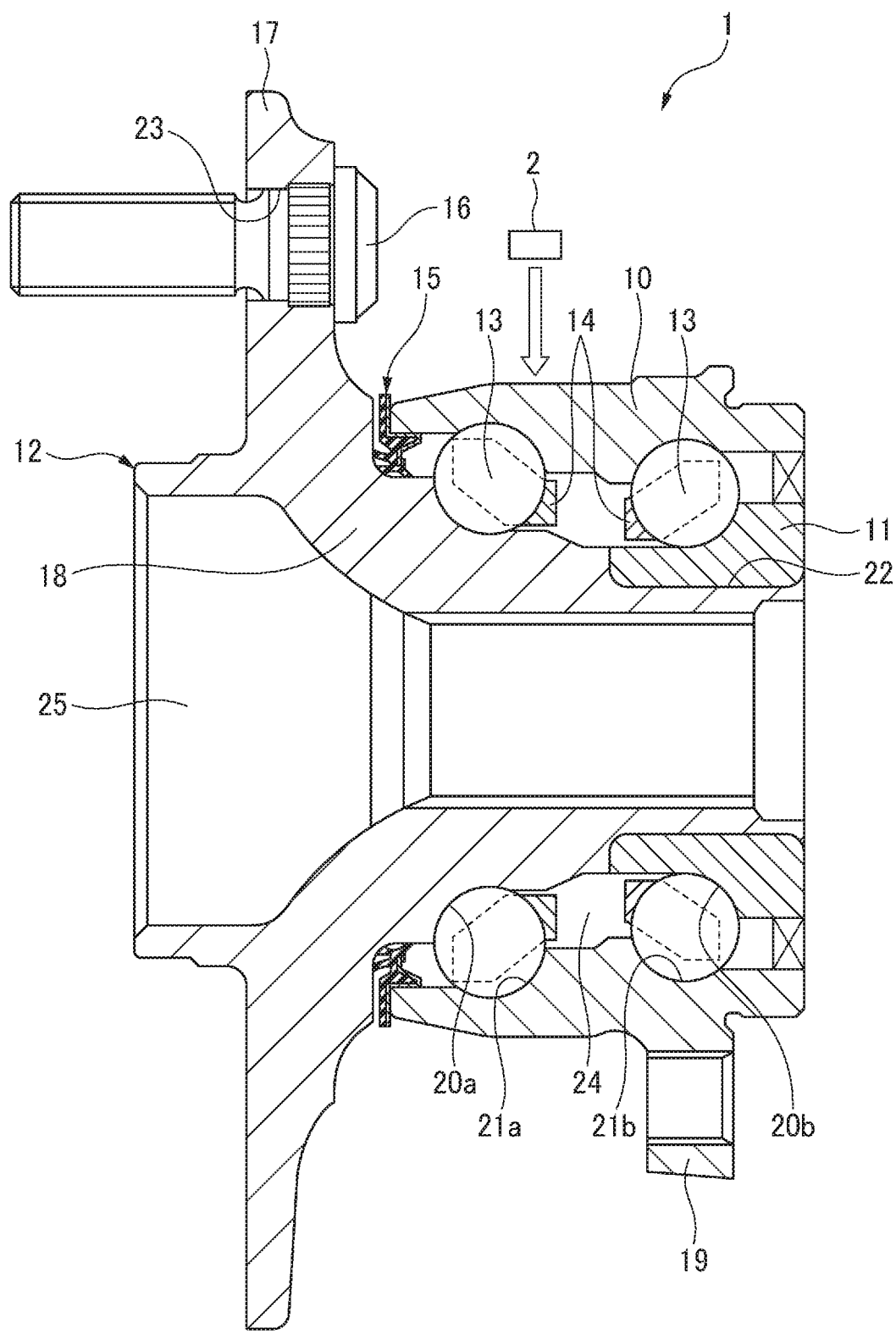
FIG. 2 is a cross-sectional view for illustrating a configuration example of a hub unit bearing according to the first embodiment.

FIG. 2 is a cross-sectional view for illustrating a configuration example of the hub unit bearing 1 according to the present embodiment. The hub unit bearing 1 according to the present embodiment will be described by taking a hub unit bearing for a drive wheel of a vehicle (not shown) as an example, whereas the present invention can be similarly applied to a hub unit bearing for a driven wheel.

The hub unit bearing 1 includes an outer ring 10, a hub 12, a plurality of rolling elements 13, a seal ring 15, and a plurality of stud bolts 16.

The outer ring 10 includes a stationary-side flange 19 on an outer peripheral surface thereof, and has double-row outer ring raceways 21a and 21b on an inner peripheral surface thereof. When the outer ring 10 is used, the stationary side flange 19 is coupled and fixed to a knuckle of a suspension device (not shown, for example, a steering unit), so that the outer ring 10 is supported by the suspension device and is not rotated.

The hub 12 is constituted by coupling a hub main body 18 that also functions as one of the inner rings and the inner ring 11, and is disposed coaxially (concentrically) with the outer ring 10 on an inner diameter side of the outer ring 10. The hub main body 18 is formed in a hollow shape.

The hub main body 18 is provided with an annular rotation-side flange 17 that extends radially outward at a portion protruding axially outward from an axially outer end opening of the outer ring 10 and supports and fixes a braking rotary member such as a wheel or a disc rotor (not shown). The stud bolts 16 are serration-fitted into a plurality of insertion holes 23 provided in the rotation-side flange 17.

An inner ring raceway 20a in the axially outer row is provided on the outer peripheral surface of the hub main body 18 at a portion facing the outer ring raceway 21a in the axially outer row provided on the inner peripheral surface of the outer ring 10. A small-diameter step portion 22 is provided at an axially inner end portion of the outer peripheral surface of the hub main body 18, the axially inner end portion facing an outer ring raceway 21b in an axially inner row provided on the inner peripheral surface of the outer ring 10.

An inner ring raceway 20b in the axially outer row is provided on an outer peripheral surface of the inner ring 11. The inner ring 11 is in a state of being externally fitted and fixed to the small-diameter step portion 22 of the hub main body 18 by tightening fitting.

The rolling elements 13 are rollably provided in a portion between the outer ring raceway 21a and the inner ring raceway 20a in the axially outer row and in a portion between the outer ring raceway 21b and the inner ring raceway 20b in the axially inner row while being held by a plurality of cages 14. In the example of FIG. 2, a spherical member is used as the rolling element 13. For example, in the case of a hub unit bearing for supporting a wheel of a heavy automobile, a conical rolling element (roller) may be used.

When the seal ring 15 is supported and fixed to an axially outer end portion of the outer ring 10, the seal ring 15 closes the axially outer end opening of an internal space 24 in which the plurality of rolling elements 13 are provided, the internal space 24 being present between the inner peripheral surface of the outer ring 10 and the outer peripheral surface of the hub 12. The seal ring 15 prevents, for example, leakage of grease filled therein and intrusion of foreign matter from the outside.

Figure 3:
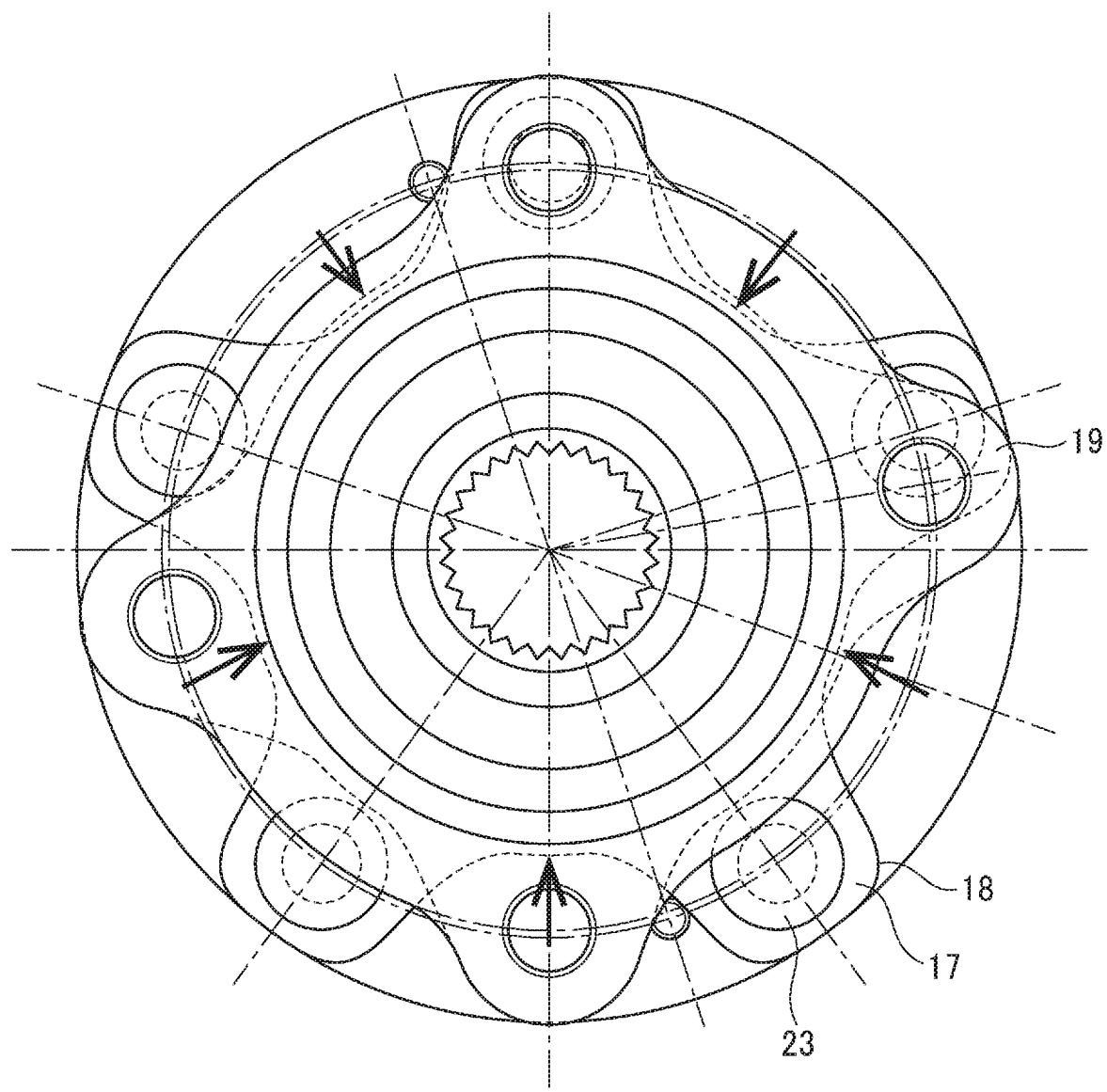
FIG. 3 is a diagram for illustrating a measurement position of a magnetic sensor of the hub unit bearing according to the first embodiment.

FIG. 3 is a diagram for illustrating a measurement position of the magnetic sensor 2 of the hub unit bearing 1 according to the present embodiment. FIG. 3 is a diagram of the hub unit bearing 1 as viewed from a vehicle body side (right side in FIG. 1). In the present embodiment, the magnetic characteristics of the radially outer end portion of the outer ring in the vicinity of the flange portion are measured by the magnetic sensor 2.

Arrows (five points in a circumferential direction) in FIG. 3 indicate measurement positions by the magnetic sensor 2. Here, in order to prevent the influence of the stud bolt 16 provided on the rotation-side flange 17 of the hub 12 on other members, the magnetic sensor 2 is installed in the middle between the insertion holes 23 to which the stud bolt 16 is serration-fitted, thereby detecting the magnetic characteristics. In the configuration shown in FIG. 2, five insertion holes 23 are provided in the hub main body 18. That is, the five rotation-side flanges 17 extend. In the configuration, there are five positions at which the magnetic sensor 2 can be installed (measured), whereas the magnetic sensor 2 may be provided at all of the positions, or the magnetic sensor 2 may be provided at only one of the positions.

[Change in Magnetic Characteristics]

In the present embodiment, a change in magnetic characteristics used for determining the state of the hub unit bearing 1 will be described. In general, when the hub unit bearing 1 is used by receiving a wheel shaft load, the hub unit bearing 1 receives a load on a rolling surface (an outer peripheral surface of the rolling element 13) or a raceway surface (a raceway of an inner ring and an outer ring), and at the same time, a bending stress is repeatedly applied to a constituent portion (for example, a portion in the vicinity of the flange portion) of the hub unit bearing 1, thereby causing bending fatigue. When the stress is applied, strain in a material constituting each portion is relaxed, and thus domain walls partitioning magnetic domains in the material are easily moved. As a result, the change in the magnetic characteristics appears at a portion where the bending fatigue occurs. That is, due to a stress change caused by the use of the hub unit bearing 1, even when the constituent portion before the stress is applied is non-magnetic (for example, retained austenite), the constituent portion becomes magnetic (for example, machining induced martensite), or the magnetic characteristics of the constituent portion change.

Figure 4A:
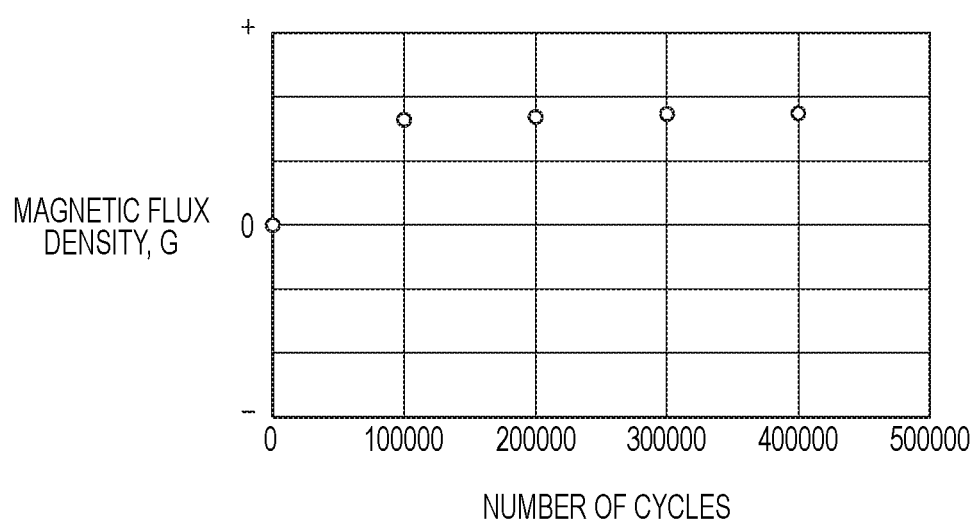
FIG. 4A is a diagram for illustrating a variation in a detection result obtained by the magnetic sensor according to the first embodiment.
Figure 4B:
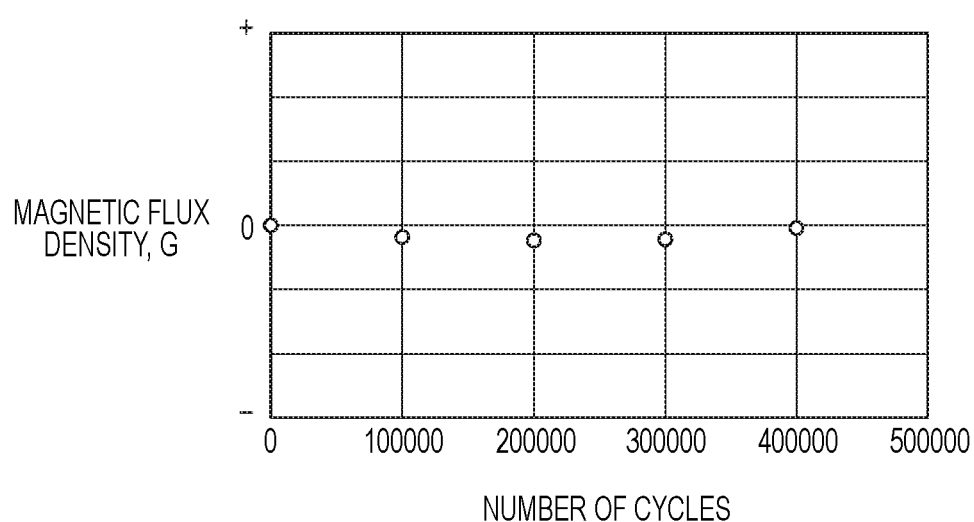
FIG. 4B is a diagram for illustrating the variation in the detection result obtained by the magnetic sensor according to the first embodiment.
Figure 4C:
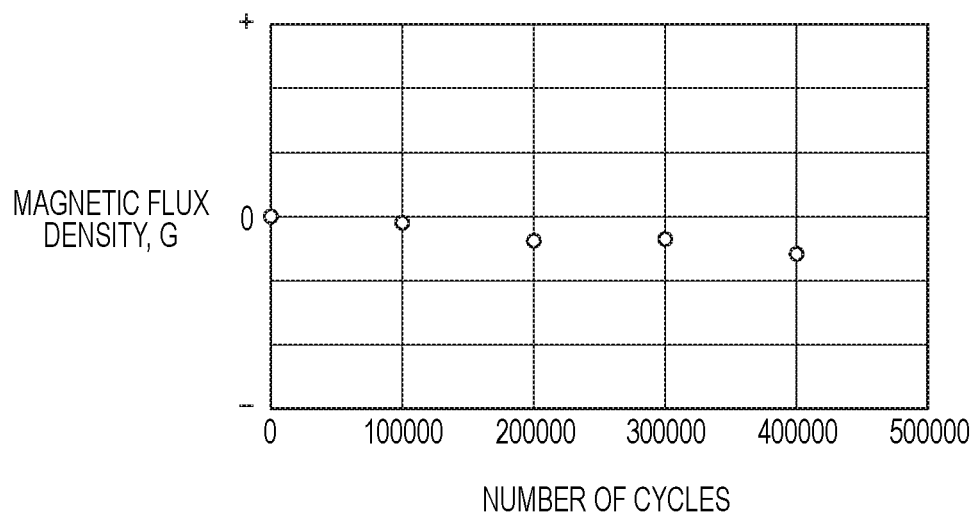
FIG. 4C is a diagram for illustrating the variation in the detection result obtained by the magnetic sensor according to the first embodiment.

Changes in the magnetic characteristics of the hub unit bearing 1 according to the present embodiment will be described with reference to FIGS. 4A to 4C. FIGS. 4A to 4C show examples of data obtained by detecting a change in the magnetic flux density at the radially outer end portion of the outer ring by the magnetic sensor 2 when the hub unit bearing 1 is placed in a loaded state and then rotated.

In FIGS. 4A to 4C, a vertical axis represents the magnetic flux density, and a value from 0 to an upper side is a positive value, and a value from 0 to the lower side is a negative value. A horizontal axis represents the number of Cycles of the hub unit bearing 1. FIGS. 4A to 4C sequentially show detection results in an x-axis direction, a y-axis direction, and a z-axis direction among three axial directions detectable by the magnetic sensor 2. In the case of the examples of FIGS. 4A to 4C, with the rotation of the hub unit bearing 1, the change in the magnetic flux density (FIG. 4A) in the x-axis direction among the three axial directions is larger.

Therefore, in the present embodiment, the magnetic characteristics at an initial time (at the time of shipment or the like) are measured in advance by the magnetic sensor 2 with respect to a predetermined portion (predetermined detection position) at which the change in the magnetic characteristics is assumed to occur due to the use of the hub unit bearing 1, and the measured magnetic characteristics are held in the holding unit 31 as reference information. Then, the state of the hub unit bearing 1 is determined by comparing the reference information held by the holding unit 31 with the magnetic characteristics of the predetermined portion of the hub unit bearing 1 which is measured as appropriate after the start of use. In the present embodiment, as described above, the radially outer end portion of the outer ring in the vicinity of the flange portion is set as the predetermined portion. For example, a position indicated by a white arrow in FIG. 2 corresponds to the detection position of the magnetic sensor 2. The predetermined position may be another position. For example, in a cavity portion 25 formed in the hub main body 18, the position may be a position at which the change in the magnetic characteristics is assumed to occur due to the use of the hub unit bearing 1.

In the present embodiment, for the sake of simplicity, the detection position of the magnetic characteristic by the magnetic sensor 2 will be described as one place. However, detection may be performed at a plurality of positions, and determination may be performed based on the detection result of each position.

In the following embodiment, as a state of the hub unit bearing 1, a plurality of levels are used as an index indicating an indication of replacement (degree of urgency), whereas the present invention is not limited thereto. For example, a degree of progress of deterioration may be indicated by a percentage or the like.

Figure 5:
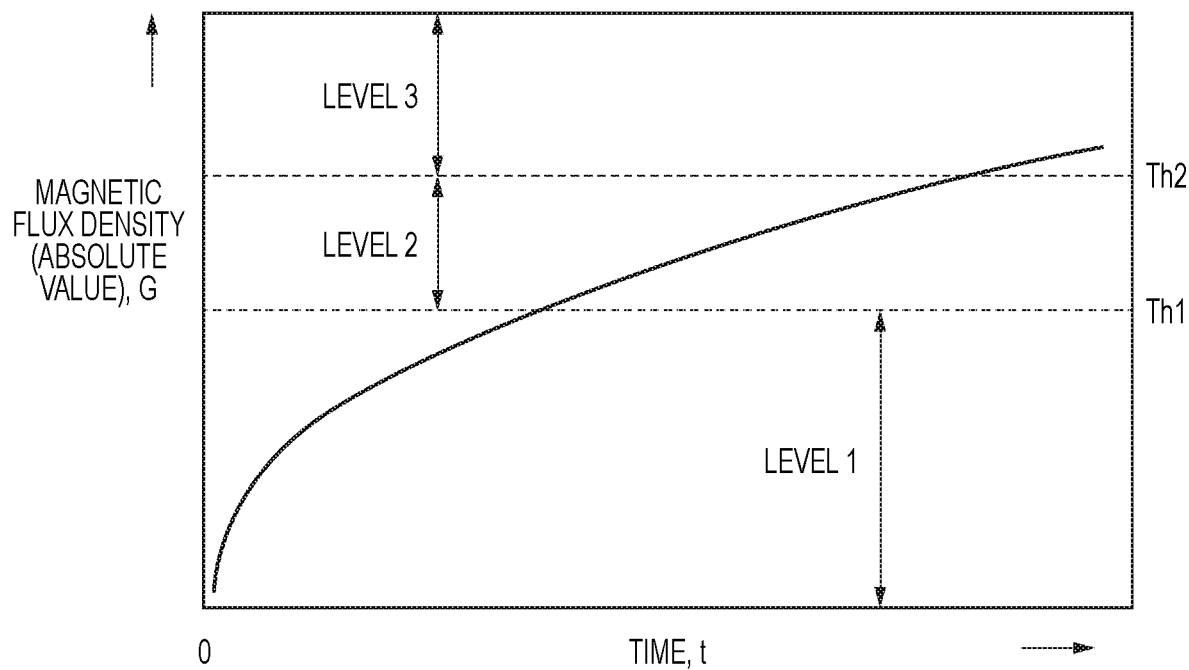
FIG. 5 is a diagram for illustrating a relationship between a magnetic flux density and a state of the hub unit bearing according to the first embodiment.

FIG. 5 is a diagram for illustrating a concept of the change in the magnetic characteristics (magnetic flux density) with the use of the hub unit bearing 1 according to the present embodiment. In FIG. 5, the vertical axis represents the magnetic flux density (absolute value), and the horizontal axis represents a passage of time from the start of use of the hub unit bearing 1. Here, in order to simplify the description, it is assumed that the hub unit bearing 1 is continuously used (rotated). As shown in FIG. 5, a change amount in the magnetic flux density with respect to the hub unit bearing 1 at the initial time increases with the passage of the use time.

In the present embodiment, it is assumed that the state of the hub unit bearing 1 is determined in three stages of level 1, level 2, and level 3, whereas the state may be subdivided into more levels. The level 1 indicates a state in which replacement of the hub unit bearing 1 is unnecessary and the hub unit bearing 1 is continuously usable. The level 2 indicates a state in which a timing to replace the hub unit bearing 1 is approaching as the hub unit bearing 1 deteriorates. The level 3 indicates a state in which the deterioration of the hub unit bearing 1 progresses and replacement is required. That is, this means that the degree of urgency of replacement of the hub unit bearing 1 increases as the level increases.

In the present embodiment, threshold values Th1 and Th2 (Th1<Th2) corresponding to the levels are used. The magnetic sensor 2 according to the present embodiment can detect the magnetic flux density in three axial (x, y, z) directions, and threshold values Th1 (Th1$x$, Th1$y$, Th1$z$) and Th2 (Th2$x$, Th2$y$, Th2$z$) are set corresponding to the respective axial directions. As the directions of the three axes in the hub unit bearing 1 according to the present embodiment, for example, a radial direction, a circumferential direction, and a central axis direction of the outer ring and inner ring can be associated with one another. In the following description, when it is necessary to individually illustrate the threshold values corresponding to the respective axial directions, subscripts of x, y, and z are added, and in other cases, the subscripts are omitted. It is assumed that each threshold value according to the present embodiment is set in advance based on a correspondence relationship between the state of the hub unit bearing 1 and the magnetic characteristics.

Each threshold value is held by, for example, the holding unit 31. Different values may be set for the three axes as the threshold values Th1 and Th2. For example, among the three axes, an axial direction having little influence on the continuous use of the hub unit bearing 1 even when the change in the magnetic characteristics is large may be set to a higher threshold value. On the other hand, among the three axes, an axial direction in which there is a high possibility of an abnormality of the hub unit bearing 1 due to the occurrence of the change even when the change in the magnetic characteristics is small may be set to a lower threshold value. A difference between the threshold value Th1 and the threshold value Th2 may be different according to the axial direction.

Reference points (origins) of the three axes are defined based on an installation position (detection position) of the magnetic sensor 2.

As shown in FIG. 5, the level 1 is set when the detected magnetic flux density (absolute value) is less than the threshold value Th1, the level 2 is set when the detected magnetic flux density (absolute value) is equal to or greater than the threshold value Th1 and less than the threshold value Th2, and the level 3 is set when the detected magnetic flux density (absolute value) is equal to or greater than the threshold value Th2. Further, in the present embodiment, the highest level among the determination results based on the detection results in the three axial directions is determined as the state of the entire hub unit bearing 1.

In the present embodiment, when the determination processing is performed, it is not necessary to magnetize the vicinity of the detection position of the hub unit bearing 1 by the magnetic sensor 2, and such an operation is also not necessary when detecting the reference magnetic characteristic.

[Determination Processing]

Figure 6:
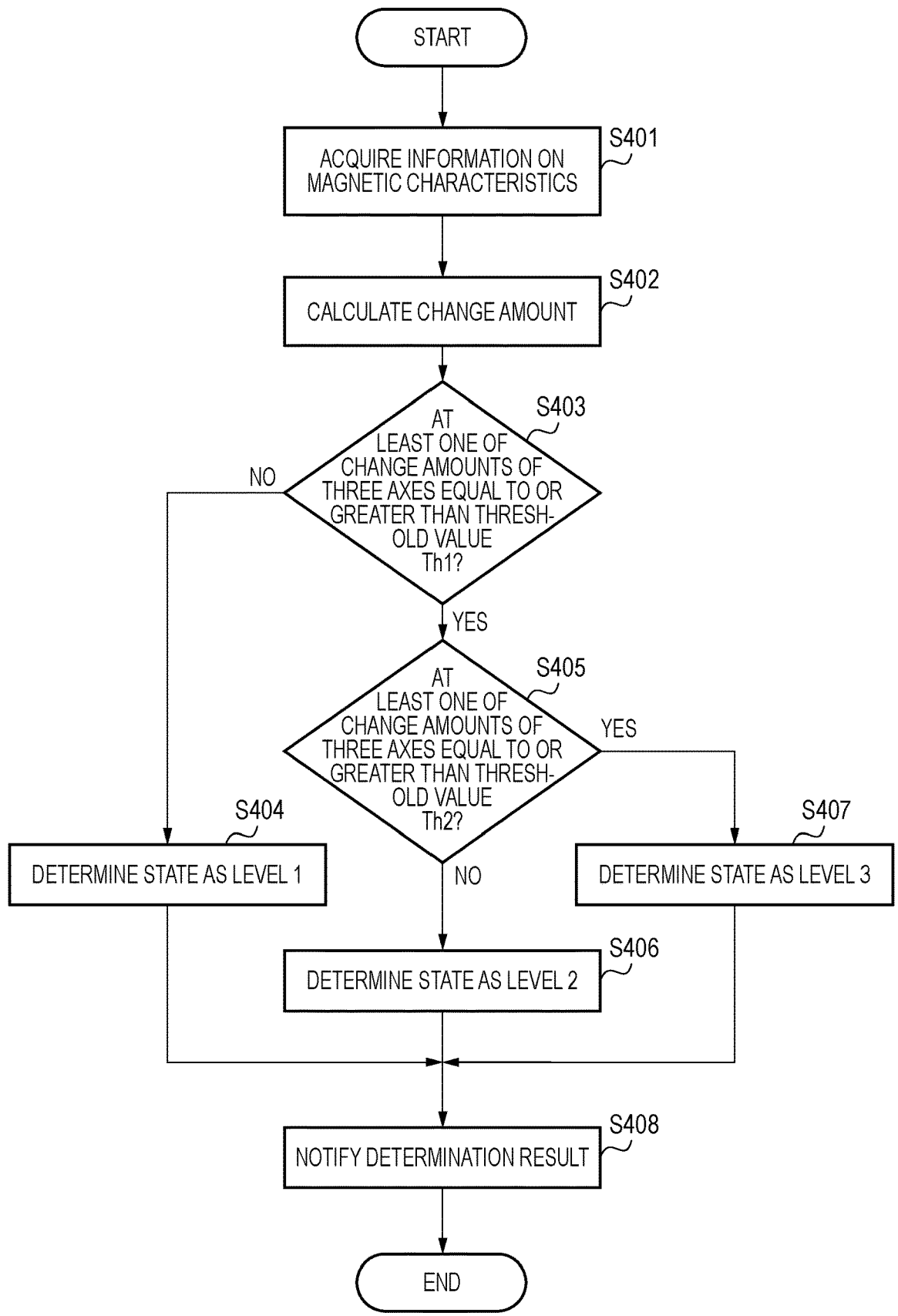
FIG. 6 is a flowchart of hub unit bearing state determination processing according to the first embodiment.

FIG. 6 is a flowchart of state determination processing of the hub unit bearing 1 according to the present embodiment. The processing is executed by the determination device 3, and may be implemented, for example, by a processing unit (not shown) such as a central processing unit (CPU) included in the determination device 3 reading and executing a program for implementing each unit shown in FIG. 1.

In addition, when the processing flow is started, it is assumed that the magnetic sensor 2 is installed at a predetermined detection position of the hub unit bearing 1, and the magnetic characteristics are detected at the position.

Each step (S401 to S408) in the flowchart of FIG. 6 will be described in detail. In S401, the determination device 3 acquires, via the acquisition unit 32, information on the magnetic characteristics of the hub unit bearing 1 (which will be described as magnetic flux density in the present embodiment) detected by the magnetic sensor 2.

In S402, the determination device 3 derives, by the derivation unit 33, the change amount in the magnetic flux density due to the use of the hub unit bearing 1 based on the magnetic flux density acquired in S401 and the reference information held by the holding unit 31.

In S403, the determination device 3 causes the determination unit 34 to perform comparison for each of the three axes by using the change amount derived in S402 and the threshold value held in the holding unit 31. As a result of the comparison, it is determined whether at least one of the change amounts of the three axes is equal to or greater than the threshold value Th1. When at least one of the change amounts is equal to or greater than the threshold value Th1 (YES in S403), the processing proceeds to S405. When both of the change amounts are less than the threshold value Th1 (NO in S403), the processing proceeds to S404.

In S404, the determination unit 34 of the determination device 3 determines that the state of the hub unit bearing 1 is level 1. Then, the processing proceeds to S408.

In S405, the determination device 3 determines whether at least one of the change amounts of the three axes is equal to or greater than a threshold value Th2. When at least one of the change amounts is equal to or greater than the threshold value Th2 (YES in S405), the processing proceeds to S407. When both of the change amounts are less than the threshold value Th2 (NO in S405), the processing proceeds to S406.

In S406, the determination unit 34 of the determination device 3 determines that the state of the hub unit bearing 1 is level 2. Then, the processing proceeds to S408.

In S407, the determination unit 34 of the determination device 3 determines that the state of the hub unit bearing 1 is level 3. Then, the processing proceeds to S408.

In S408, the determination device 3 performs a notification operation by the notification unit 35 based on the determination result in S404, S406, or S407. Then, the processing flow is terminated.

As described above, according to the present embodiment, it is possible to easily determine the state of the hub unit bearing. For example, it is possible to determine the state of the hub unit bearing without disassembling or breaking the hub unit bearing itself. Further, in the hub unit bearing according to the present embodiment, before the hub unit bearing is damaged due to fatigue, wear, seizure, or the like caused by use, the state determination based on the stress change of the hub unit bearing caused by use can be performed to specify the replacement timing.

Second Embodiment

A second embodiment according to the present invention will be described. The description of the same configuration and the same processing as those of the first embodiment will be omitted, and description will be given focusing on differences. For example, the overall configuration is the same as the configuration of FIG. 1 described in the first embodiment.

In the first embodiment, the state is determined based on the change amount (absolute value) in the magnetic flux density as described with reference to FIG. 5. In the present embodiment, the hub unit bearing 1 to be determined is caused to perform a predetermined rotation operation, and the state is determined based on the change amount in the magnetic flux density during the rotation operation. In the present embodiment, a rotation operation for one rotation (one circumference) is described as an example of the predetermined rotation operation, whereas the predetermined rotation operation is not limited thereto. For example, a difference between a maximum value and a minimum value may be used by performing a plurality of rotation operations, or a difference may be used by calculating an average of the maximum value and an average of the minimum value of each circumference by performing a plurality of rotation operations. The level used as the determination result is the same as that in the first embodiment.

[Change in Magnetic Characteristics]

The method according to the first embodiment is suitable for a case where the change in the magnetic characteristics of the hub unit bearing 1 occurs over the entire hub unit bearing 1. On the other hand, depending on the use of the hub unit bearing 1, the magnetic characteristics may locally change. Assuming such a case, a method according to the present embodiment is applied.

Figure 7:
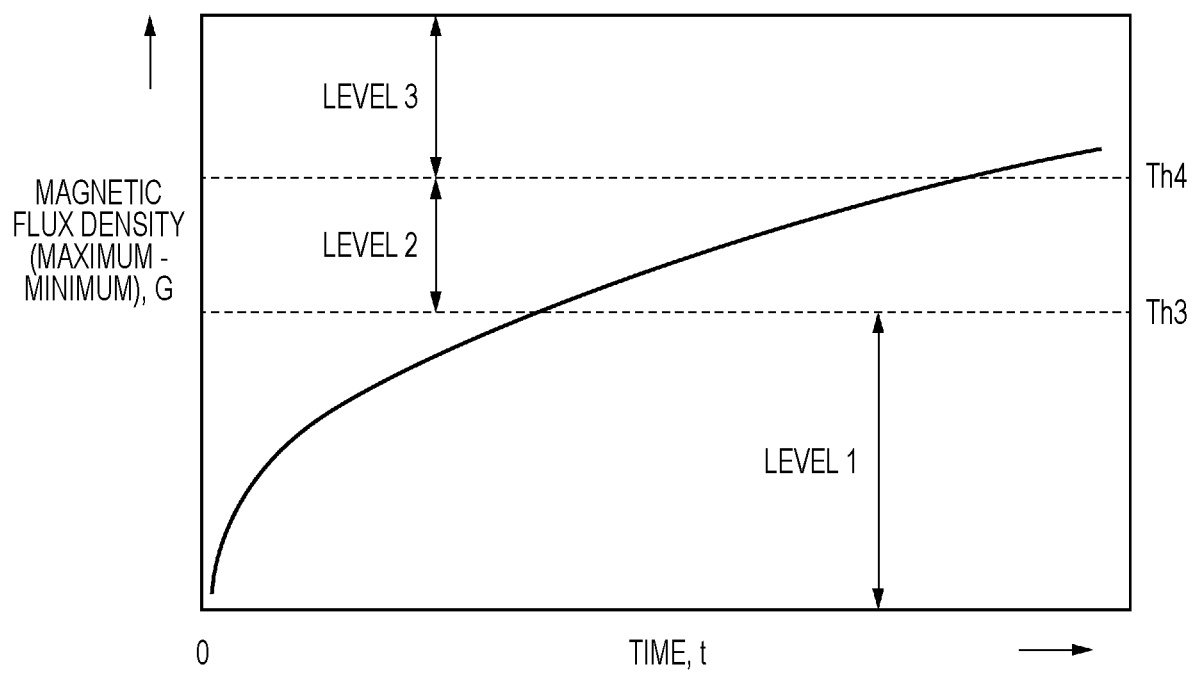
FIG. 7 is a diagram for illustrating a relationship between a magnetic flux density and a state of a hub unit bearing according to a second embodiment.

FIG. 7 is a diagram for illustrating a concept of the change in the magnetic characteristics (magnetic flux density) with the use of the hub unit bearing 1. In FIG. 5, the vertical axis represents the magnetic flux density (the difference between the maximum value and the minimum value of the magnetic flux density during the rotation operation), and the horizontal axis represents the passage of time from the start of use of the hub unit bearing 1. Here, in order to simplify the description, it is assumed that the hub unit bearing 1 is continuously used (rotated). Also in this case, as in FIG. 5, the difference between the maximum value and the minimum value of the magnetic flux density (hereinafter, also referred to as a "change width") increases with the passage of the use time.

In the present embodiment, threshold values Th3 and Th4 (Th3<Th4) corresponding to the levels are used. The magnetic sensor 2 according to the present embodiment can detect the magnetic flux density in three axial (x, y, z) directions, and threshold values Th3 (Th3x, Th3y, Th3z) and Th4 (Th4x, Th4y, Th4z) are set in each direction. In the following description, when it is necessary to individually illustrate the threshold values corresponding to the respective axial directions, subscripts of x, y, and z are added, and in other cases, the subscripts are omitted. It is assumed that each threshold value according to the present embodiment is set in advance based on a correspondence relationship between the state of the hub unit bearing 1 and the magnetic characteristics.

Each threshold value is held by, for example, the holding unit 31. Different values may be set for the three axes as the threshold values Th3 and Th4. For example, among the three axes, an axial direction having little influence on the continuous use of the hub unit bearing 1 even when the change width in the magnetic characteristics is large may be set to a higher threshold value. On the other hand, among the three axes, an axial direction in which there is a high possibility of an abnormality of the hub unit bearing 1 due to the occurrence of the change even when the change width in the magnetic characteristics is small may be set to a lower threshold value. A difference between the threshold value Th3 and the threshold value Th4 may be different according to the axial direction.

Reference points (origins) of the three axes are defined based on an installation position (detection position) of the magnetic sensor 2.

As shown in FIG. 7, the level 2 is set when the detected magnetic flux density (change width) is equal to or greater than the threshold value Th3 and less than the threshold value Th4, and the level 3 is set when the detected magnetic flux density (change width) is equal to or greater than the threshold value Th4. Further, in the present embodiment, the highest level among the determination results based on the detection results in the three axial directions is determined as the state of the entire hub unit bearing 1.

[Determination Processing]

Figure 8:
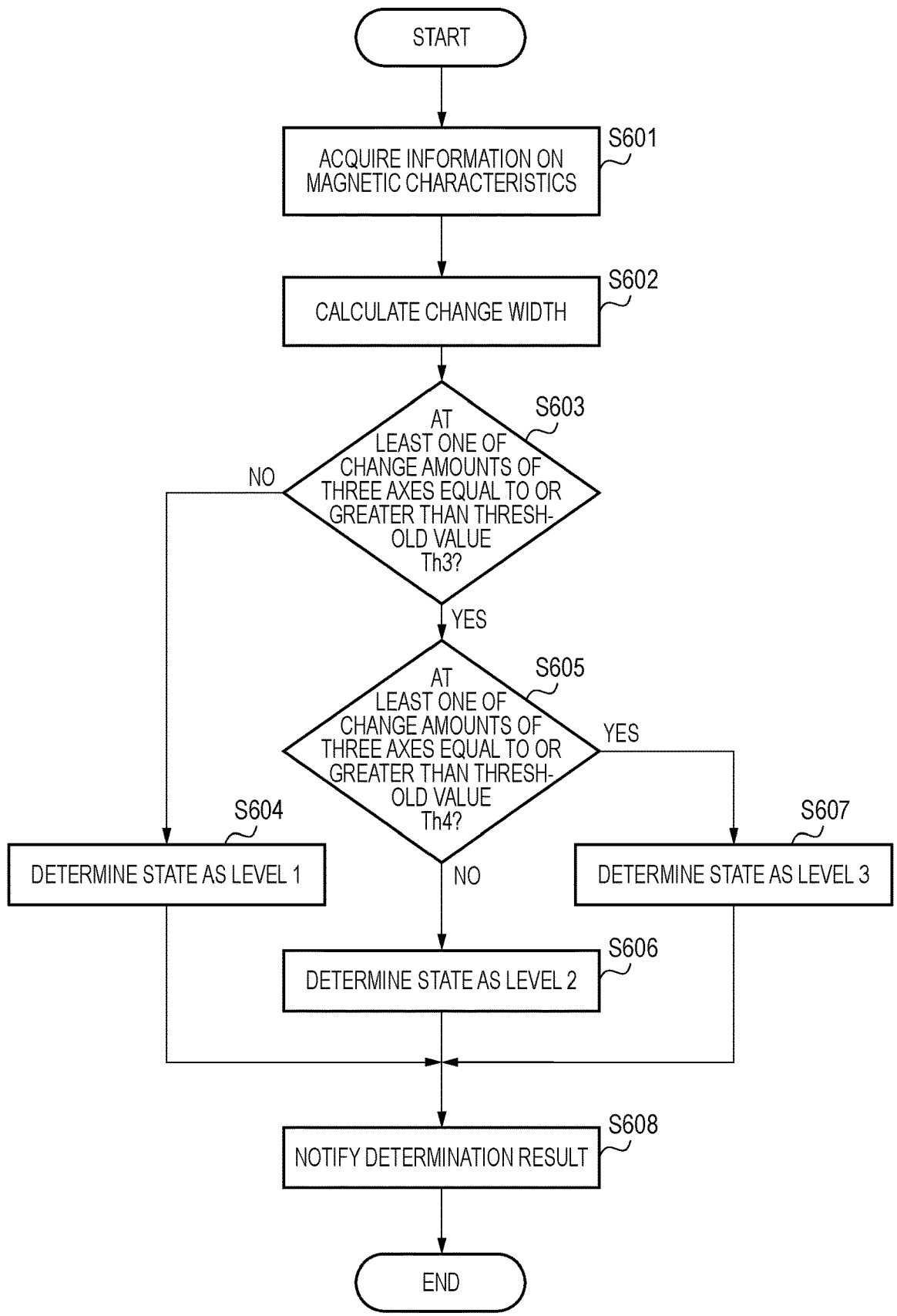
FIG. 8 is a flowchart of hub unit bearing state determination processing according to the second embodiment.

FIG. 8 is a flowchart of state determination processing of the hub unit bearing 1 according to the present embodiment. The processing is executed by the determination device 3, and may be implemented, for example, by a processing unit (not shown) such as a central processing unit (CPU) included in the determination device 3 reading and executing a program for implementing each unit shown in FIG. 1.

When the processing flow is started, it is assumed that the magnetic sensor 2 is installed at a predetermined detection position of the hub unit bearing 1, and the magnetic characteristics during the predetermined rotation operation (one rotation in the case of the present embodiment) are detected.

Each step (S601 to S608) in the flowchart of FIG. 8 will be described in detail. In S601, the determination device 3 acquires, via the acquisition unit 32, information on the magnetic characteristics (which will described as the magnetic flux density in the present embodiment) of the hub unit bearing 1 during one rotation operation detected by the magnetic sensor 2.

In S602, the determination device 3 derives a difference (change width) between a maximum value and a minimum value in the magnetic flux density acquired in S601 by the derivation unit 33.

In S603, the determination device 3 causes the determination unit 34 to perform comparison for each of the three axes by using the change width derived in S602 and the threshold value held in the holding unit 31. As a result of the comparison, it is determined whether at least one of the change widths of the three axes is equal to or greater than the threshold value Th3. When at least one of the change widths is equal to or greater than the threshold value Th3 (YES in S603), the processing proceeds to S605. When both of the change widths are less than the threshold value Th3 (NO in S603), the processing proceeds to S604.

In S604, the determination unit 34 of the determination device 3 determines that the state of the hub unit bearing 1 is the level 1. Then, the processing proceeds to S608.

In S605, as a result of the comparison in S603, the determination device 3 determines whether at least one of the change widths of the three axes is equal to or greater than the threshold value Th4. When at least one of the change widths is equal to or greater than the threshold value Th4 (YES in S605), the processing proceeds to S607. When both of the change widths are less than the threshold value Th4 (NO in S605), the processing proceeds to S606.

In S606, the determination unit 34 of the determination device 3 determines that the state of the hub unit bearing 1 is the level 2. Then, the processing proceeds to S608.

In S607, the determination unit 34 of the determination device 3 determines that the state of the hub unit bearing 1 is the level 3. Then, the processing proceeds to S608.

In S608, the determination device 3 performs the notification operation by the notification unit 35 based on the determination result in S604, S606, or S607. Then, the processing flow is terminated.

As described above, according to the present embodiment, it is possible to easily determine the state of the hub unit bearing. In particular, it is possible to determine the state of the hub unit bearing even when the change in the magnetic characteristics is local.

Third Embodiment

A third embodiment according to the present invention will be described. The description of the same configuration and the same processing as those of the first embodiment will be omitted, and description will be given focusing on differences. As a difference from the first embodiment, an installation position (detection position) of the magnetic sensor 2 in the hub unit bearing 1 is different.

Figure 9:
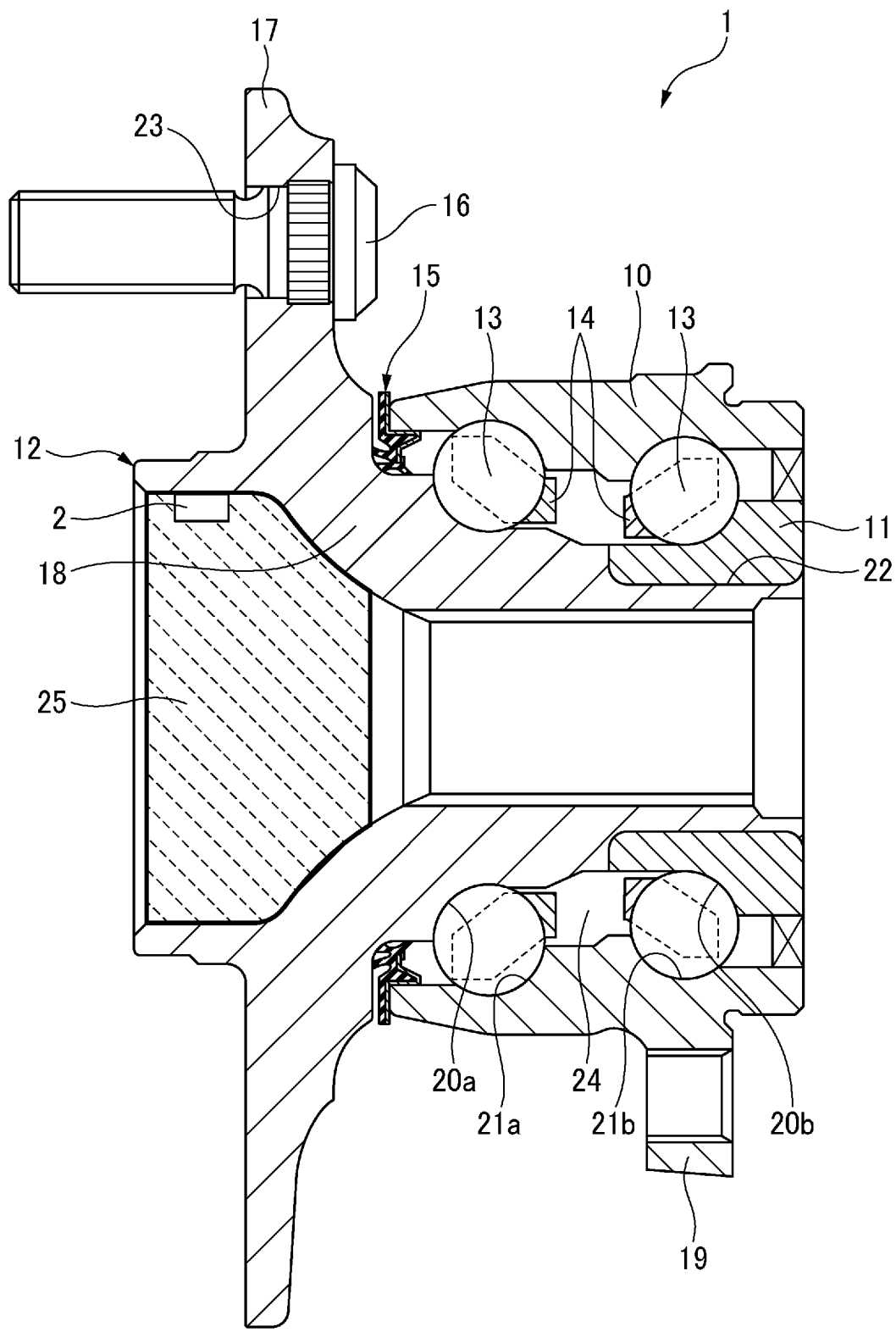
FIG. 9 is a cross-sectional view for illustrating a configuration example of a hub unit bearing according to a third embodiment.

FIG. 9 is a diagram for illustrating the installation position of the magnetic sensor 2 of the hub unit bearing 1 according to the present embodiment. In FIG. 9, the cavity portion 25 of the hub main body 18 is emphasized, and in the present embodiment, the magnetic sensor 2 is installed in the cavity portion 25. Also in the present embodiment, the magnetic sensor 2 is installed in the cavity portion 25 so as to detect the magnetic characteristics in the vicinity of the flange portion as shown in FIG. 3 of the first embodiment.

Figure 10A:
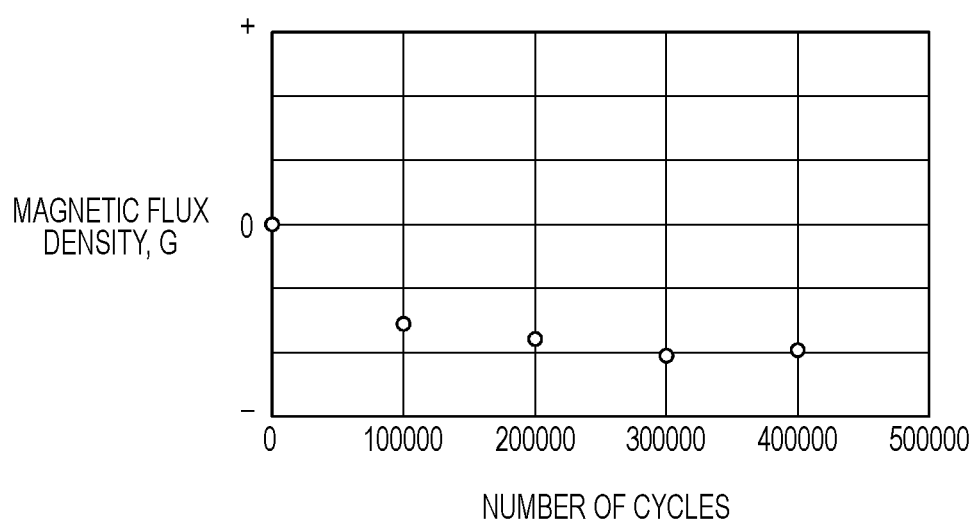
FIG. 10A is a diagram for illustrating a variation in a detection result obtained by a magnetic sensor according to the third embodiment.
Figure 10B:
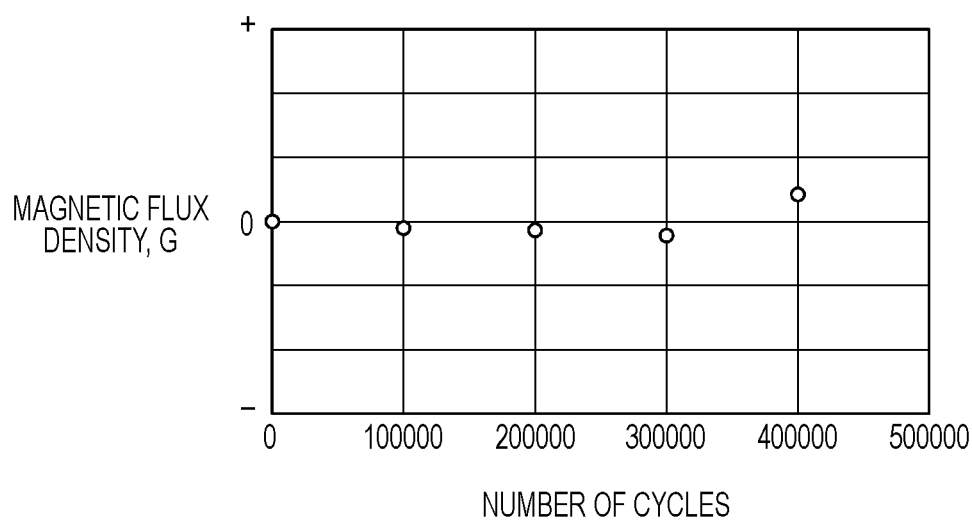
FIG. 10B is a diagram for illustrating the variation in the detection result obtained by the magnetic sensor according to the third embodiment.
Figure 10C:
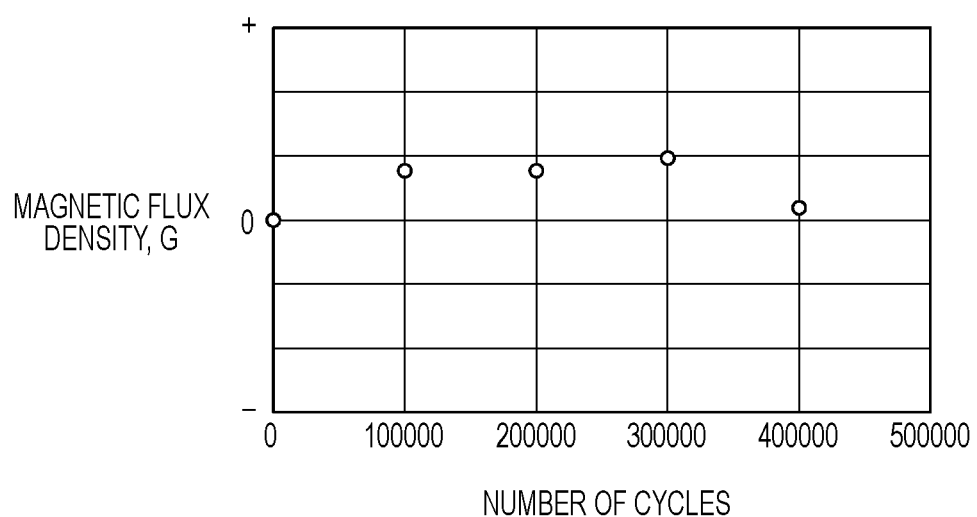
FIG. 10C is a diagram for illustrating the variation in the detection result obtained by the magnetic sensor according to the third embodiment.

Changes in the magnetic characteristics of the hub unit bearing 1 according to the present embodiment will be described with reference to FIGS. 10A to 10C. FIGS. 10A to 10C show examples of data obtained by detecting a change in the magnetic density of the cavity portion 25 by the magnetic sensor 2 when the hub unit bearing 1 is placed in a loaded state and then rotated.

In FIGS. 10A to 10C, a vertical axis represents the magnetic flux density, and a value from 0 to an upper side is a positive value, and a value from 0 to the lower side is a negative value. A horizontal axis represents the number of cycles of the hub unit bearing 1. FIGS. 10A to 10C sequentially show detection results in an x-axis direction, a y-axis direction, and a z-axis direction among three axial directions detectable by the magnetic sensor 2. In the examples of FIGS. 10A to 10C, the degree of change in the magnetic flux density in each of the three axial directions varies depending on the number of cycles.

Also in the present embodiment, the magnetic characteristics at an initial time (at the time of shipment or the like) of a predetermined portion (cabinet portion) at which it is assumed that the change in the magnetic characteristics occurs due to the use of the hub unit bearing 1 are measured in advance by the magnetic sensor, and the measured magnetic characteristics are held as reference information in the holding unit 31. Then, the state of the hub unit bearing 1 is determined by comparing the reference information held by the holding unit 31 with the magnetic characteristics of the predetermined portion of the hub unit bearing 1 which is measured as appropriate after the start of use.

Also in the configuration of FIG. 9, it is possible to detect the change in the magnetic characteristics due to the stress change. Therefore, as in the first and second embodiments, it is possible to determine the state of the hub unit bearing 1 according to the detection result of the magnetic sensor 2.

As described above, according to the present embodiment, it is possible to provide a hub unit bearing capable of easily determining the state.

Other Embodiments

The processing in the first embodiment and the processing in the second embodiment are not exclusive, and the processing in the first embodiment and the processing in the second embodiment may be combined, and the state of the hub unit bearing 1 may be determined based on the results of both the change amount and the change width. Accordingly, it is possible to detect changes in the overall and local magnetic characteristics and to more accurately determine the state of the hub unit bearing 1.

The configuration in the first embodiment (FIG. 2) and the configuration in the third embodiment (FIG. 9) are not exclusive, whereas the magnetic sensor may be provided at both positions, and the state of the hub unit bearing 1 may be determined based on the detection results at both positions.

In the above-described embodiments, the determination is performed using the threshold value or the reference value set in advance, whereas the present invention is not limited to the above method. For example, the determination may be performed using a learned model learned using predetermined learning data. As the learning at this time, for example, a learned model may be generated by supervised learning using learning data including a pair of a detection result (input data) of the magnetic characteristics of the hub unit bearing 1 and a state (teacher data) of the hub unit bearing 1. As the teacher data, a level corresponding to the state of the hub unit bearing 1 may be used as in the above-described embodiments, or presence or absence of crack occurrence, a degree of fatigue progress, or the like may be used.

The degree of fatigue progress here is a value that can be used when obtaining a remaining life of the hub unit bearing 1. For example, as a method of obtaining the remaining life of the hub unit bearing 1, the degree of fatigue progress can be calculated by the following formula (1) from a time (measurement execution time) until the target hub unit bearing 1 is rotated and a predetermined measurement is executed and a time until peeling occurs in the raceway (peeling time).

$$\text{Degree of fatigue progress} = (\text{measurement execution time})/(\text{peeling time}) \times 100 \quad (1)$$

As the predetermined measurement, an X-ray analysis method using an X-ray analysis device can be applied. First, a half-value width of martensite and a retained austenite amount in the measurement unit are measured using an X-ray analysis device before use and after constant use (rotation) is performed on the target hub unit bearing 1, a decrease amount ($\delta a$) in the half-value of martensite and a decrease amount ($\delta b$) in the retained austenite from before use are obtained, and a degree of X-ray fatigue is calculated from the following formula (2). The measurement unit may be any of the inner ring raceway surface, the outer ring raceway surface, and the rolling surface of the hub unit bearing 1.

$$\text{Degree of X-ray fatigue} = (\delta a) + C \times (\delta b) \quad (2).$$

(C: Coefficient determined by material or heat treatment)

It is possible to specify the remaining life of the hub unit bearing 1 by a correlation between the degree of fatigue progress and the degree of X-ray fatigue.

Then, the state determination of the hub unit bearing 1 may be performed by inputting the detection result of the magnetic characteristics of the hub unit bearing 1 to be determined to the learned model.

Further, in the present invention, programs and applications for implementing the functions of one or more embodiments described above can be supplied to a system or a device by using a network, a storage medium, or the like, and one or more processors in the system or a computer of the device can read and execute the programs to implement the functions.

Further, the functions may be implemented by a circuit (for example, an application specific integrated circuit (ASIC) or a field programmable gate array (FPGA)) that implements one or more functions. Furthermore, in machine learning, a graphical processing unit (GPU) or the like may be used in addition to a central processing unit (CPU).

As described above, the present description discloses the following matters.

(1) A state determination device for a hub unit bearing includes:
a holding unit that holds reference information of magnetic characteristics at a predetermined position in the vicinity of a flange portion included in the hub unit bearing;
an acquisition unit that acquires measurement information of the magnetic characteristics at the predetermined position of the hub unit bearing;
a derivation unit that derives a change amount between the reference information held by the holding unit and the measurement information acquired by the acquisition unit; and
a determination unit that determines a state of the hub unit bearing based on the change amount derived by the derivation unit, in which
the predetermined position is a position at which the magnetic characteristics vary with a stress change with respect to the flange portion.

According to the configuration, it is possible to easily determine the state of the hub unit bearing.

(2) The state determination device for the hub unit bearing according to (1), in which the hub unit bearing includes
an outer ring having an outer ring raceway on an inner peripheral surface thereof,
a hub having an inner ring raceway facing the outer ring raceway of the outer ring on an outer peripheral surface thereof, and
a plurality of rolling elements rollably provided between the outer ring raceway and the inner ring raceway, and
the predetermined position is a radially outer end portion of the outer ring in the vicinity of the flange portion.

According to the configuration, it is possible to easily determine the state of the hub unit bearing based on the change in the magnetic characteristics in the cavity portion of the hub in the vicinity of the flange portion.

(3) The state determination device according to (1) or (2), in which the magnetic characteristic is a magnetic flux density, and
the reference information and the measurement information include information in three axial directions of the magnetic flux density.

According to the configuration, it is possible to more accurately determine the state of the hub unit bearing by detecting the change in the magnetic flux density, which is the magnetic characteristic, in each of the three axial directions.

(4) The state determination device according to (3), in which the determination unit
determines that, when the change amount in at least one of the three axial directions exceeds a first threshold value in the change amount derived by the derivation unit, the hub unit bearing is in a first state indicating that a timing at which replacement of the hub unit bearing is required is approaching, and
determines that, when the change amount in at least one of the three axial directions exceeds a second threshold value larger than the first threshold value in the change amount derived by the derivation unit, the hub unit bearing is in a second state in which a degree of urgency of replacement of the hub unit bearing is higher than that in the first state.

According to the configuration, by determining the state of the hub unit bearing based on the change assumed to have the highest degree of urgency among the changes in the magnetic characteristics of the hub unit bearing, it is possible to specify a safer replacement timing.

(5) The state determination device for the hub unit bearing according to (1), further includes:
an acquisition unit that acquires measurement information of the magnetic characteristics in the vicinity of the flange portion of the hub unit bearing during a predetermined rotation operation;
a derivation unit that derives a difference between a maximum value and a minimum value in the measurement information acquired by the acquisition unit; and
a determination unit that determines a state of the hub unit bearing based on the difference derived by the derivation unit, in which
the predetermined position is the position at which the magnetic characteristics vary with the stress change with respect to the flange portion.

According to the configuration, it is possible to easily determine the state of the hub unit bearing. In particular, it is possible to determine the state of the hub unit bearing even when the change in the magnetic characteristics is local.

(6) The state determination device according to (5), in which the predetermined operation is an operation corresponding to one rotation of the hub unit bearing.

According to the configuration, it is possible to easily determine the state of the hub unit bearing by performing one rotation operation at the time of determining the state of the hub unit bearing.

(7) The state determination device according to (5) or (6), in which the magnetic characteristic is a magnetic flux density, and the measurement information includes information on magnetic flux density in three axial directions.

According to the configuration, it is possible to more accurately determine the state of the hub unit bearing by detecting the change in the magnetic flux density, which is the magnetic characteristic, in each of the three axial directions.

(8) The state determination device according to (7), in which the determination unit determines that, when the difference in at least one of the three axial directions exceeds a first threshold value in the difference derived by the derivation unit, the hub unit bearing is in a first state indicating that a timing at which replacement of the hub unit bearing is required is approaching, and determines that, when the difference in at least one of the three axial directions exceeds a second threshold value larger than the first threshold value in the change amount derived by the derivation unit, the hub unit bearing is in a second state in which a degree of urgency of replacement of the hub unit bearing is higher than that in the first state.

According to the configuration, by determining the state of the hub unit bearing based on the change assumed to have the highest degree of urgency among the changes in the magnetic characteristics of the hub unit bearing, it is possible to specify a safer replacement timing.

(9) The state determination device according to any one of (1) to (8), further includes: a notification unit that notifies a determination result by the determination unit.

According to the configuration, it is possible to notify a desired notification destination of the determined state determination of the hub unit bearing.

(10) The state determination device according to any one of (1) to (9), in which the hub unit bearing includes a magnetic sensor for detecting the magnetic characteristics.

According to the configuration, it is possible to determine the state of the hub unit bearing based on the detection result of the magnetic sensor provided in the hub unit bearing.

(11) The state determination device according to any one of (1) to (9), in which the hub unit bearing is provided with a magnetic sensor for detecting the magnetic characteristics at the predetermined position when determining a state.

According to the configuration, it is possible to determine the state of the hub unit bearing based on the detection result of the external magnetic sensor.

(12) A state determination method for a hub unit bearing includes:

an acquisition step of acquiring measurement information of magnetic characteristics at a predetermined position in the vicinity of a flange portion included in the hub unit bearing;

a derivation step of deriving a change amount between reference information of the magnetic characteristic at the predetermined position in the vicinity of the flange portion and the measurement information acquired in the acquisition step; and a determination step of determining the state of the hub unit bearing based on the change amount derived in the derivation step, in which the predetermined position is a position at which the magnetic characteristics vary with the stress change with respect to the flange portion.

According to the configuration, it is possible to easily determine the state of the hub unit bearing.

(13) A state determination method for a hub unit bearing includes:

an acquisition step of acquiring measurement information of magnetic characteristics in the vicinity of a flange portion of the hub unit bearing during a predetermined rotation operation;

a derivation step of deriving a difference between a maximum value and a minimum value in the measurement information acquired in the acquisition step; and a determination step of determining the state of the hub unit bearing based on the difference derived in the derivation step, in which the predetermined position is a position at which the magnetic characteristics vary with the stress change with respect to the flange portion.

According to the configuration, it is possible to easily determine the state of the hub unit bearing. In particular, it is possible to determine the state of the hub unit bearing even when the change in the magnetic characteristics is local.

(14) A program which causes a computer to function as:

a holding unit that holds reference information of magnetic characteristics at a predetermined position in the vicinity of a flange portion included in the hub unit bearing;

an acquisition unit that acquires measurement information of the magnetic characteristics at the predetermined position of the hub unit bearing;

a derivation unit that derives a change amount between the reference information held by the holding unit and the measurement information acquired by the acquisition unit; and a determination unit that determines a state of the hub unit bearing based on the change amount derived by the derivation unit, in which the predetermined position is a position at which the magnetic characteristics vary with the stress change with respect to the flange portion.

According to the configuration, it is possible to easily determine the state of the hub unit bearing.

(15) A program which causes a computer to function as:

an acquisition unit that acquires measurement information of the magnetic characteristics in the vicinity of the flange portion of the hub unit bearing during a predetermined rotation operation;

a derivation unit that derives a difference between a maximum value and a minimum value in the measurement information acquired by the acquisition unit; and a determination unit that determines a state of the hub unit bearing based on the difference derived by the derivation unit, in which the predetermined position is a position at which the magnetic characteristics vary with the stress change with respect to the flange portion.

According to the configuration, it is possible to easily determine the state of the hub unit bearing. In particular, it is possible to determine the state of the hub unit bearing even when the change in the magnetic characteristics is local.

As described above, the present description discloses the following matters.

(16) A hub unit bearing includes: an outer ring having an outer ring raceway on an inner peripheral surface thereof; a hub having an inner ring raceway on an outer peripheral surface thereof, the inner ring raceway facing the outer ring raceway of the outer ring; and a plurality of rolling elements rollably provided between the outer ring raceway and the inner ring raceway, the hub unit bearing further includes:

a magnetic sensor that detects magnetic characteristics in the vicinity of a flange portion provided in the hub unit bearing, in which a detection position detected by the magnetic sensor is a position at which the magnetic characteristics vary with the stress change with respect to the flange portion.

According to the configuration, it is possible to easily determine the state of the hub unit bearing.

(17) The hub unit bearing according to (16), in which the detection position is a radially outer end portion of the outer ring in the vicinity of the flange portion.

According to the configuration, it is possible to easily determine the state of the hub unit bearing based on the change in the magnetic characteristics at the radially outer end portion of the outer ring in the vicinity of the flange portion.

(18) The hub unit bearing according to (16), in which the detection position is a cavity portion of the hub in the vicinity of the flange portion.

According to the configuration, it is possible to easily determine the state of the hub unit bearing based on the change in the magnetic characteristics in the cavity portion of the hub in the vicinity of the flange portion.

(19) The hub unit bearing according to any one of (16) to (18), in which a plurality of the magnetic sensors are provided.

According to the configuration, it is possible to more accurately determine the state of the hub unit bearing by detecting the change in the magnetic characteristics at a plurality of positions.

(20) The hub unit bearing according to any one of claims (16) to (19), in which the magnetic characteristic is a magnetic flux density, and the magnetic sensor detects magnetic flux densities in three axial directions.

According to the configuration, it is possible to more accurately determine the state of the hub unit bearing by detecting the change in the magnetic flux density, which is the magnetic characteristic, in each of the three axial directions.

(21) The hub unit bearing according to any one of (16) to (20), in which a state of the hub unit bearing is determined based on a difference between a detection result detected by the magnetic sensor and reference information set in advance.

According to the configuration, it is possible to easily determine the state of the hub unit bearing based on the difference between the detection result of the magnetic characteristics detected by the magnetic sensor and the reference information set in advance.

Although various embodiments have been described above with reference to the drawings, it is needless to say that the present invention is not limited to such examples. It is apparent to those skilled in the art that various changes and modifications can be conceived within the scope of the claims, and it is also understood that such variations and modifications belong to the technical scope of the present invention. In addition, constituent elements in the embodiments described above may be combined freely within a range not departing from the spirit of the present invention.

The present application is based on Japanese patent applications (Japanese Patent Application No. 2020-022734, Japanese Patent Application No. 2020-022733) filed on Feb. 13, 2020, the contents of which are incorporated herein by reference.

REFERENCE SIGNS LIST 1 hub unit bearing
2 magnetic sensor
3 determination device
10 outer ring
11 inner ring
12 hub
13 rolling element
14 cage
15 seal ring
16 stud bolt
17 rotation-side flange
18 hub main body
19 stationary-side flange
20a, 20b inner ring raceway
21a, 21b outer ring raceway
22 small-diameter step portion
23 insertion hole
24 internal space
25 cavity portion
31 holding unit
32 acquisition unit
33 derivation unit
34 determination unit
35 notification unit

The invention claimed is:

1. A state determination device for a hub unit bearing comprising:

a holding unit configured to hold reference information of magnetic characteristics at a predetermined position in the vicinity of a flange portion included in the hub unit bearing;

an acquisition unit configured to acquire measurement information, of the magnetic characteristics at the predetermined position of the hub unit bearing, by communicating with a magnetic sensor that is of the hub unit bearing and is configured to detect the magnetic characteristics;

a derivation unit configured to derive a change amount between the reference information held by the holding unit and the measurement information acquired by the acquisition unit; and a determination unit configured to determine a state of the hub unit bearing based on the change amount derived by the derivation unit, wherein the predetermined position is a position at which the magnetic characteristics vary with a stress change with respect to the flange portion, the magnetic characteristics comprise a magnetic flux density, and the reference information and the measurement information include information in three axial directions of the magnetic flux density.

2. The state determination device for the hub unit bearing according to claim 1, wherein the hub unit bearing includes an outer ring having an outer ring raceway on an inner peripheral surface thereof, a hub having an inner ring raceway facing the outer ring raceway of the outer ring on an outer peripheral surface thereof, and a plurality of rolling elements rollably provided between the outer ring raceway and the inner ring raceway, and the predetermined position is a radially outer end portion of the outer ring in the vicinity of the flange portion.

3. The state determination device according to claim 1, wherein the determination unit determines that, when the change amount in at least one of the three axial directions exceeds a first threshold value in the change amount derived by the derivation unit, the hub unit bearing is in a first state indicating that a timing at which replacement of the hub unit bearing is required is approaching, and determines that, when the change amount in at least one of the three axial directions exceeds a second threshold value larger than the first threshold value in the change amount derived by the derivation unit, the hub unit bearing is in a second state in which a degree of urgency of replacement of the hub unit bearing is higher than that in the first state.

4. The state determination device according to claim 1, further comprising:

a notification unit configured to notify a determination result by the determination unit.

5. The state determination device according to claim 1, wherein the hub unit bearing includes a magnetic sensor for detecting the magnetic characteristics.

6. The state determination device according to claim 1, wherein the hub unit bearing is provided with a magnetic sensor for detecting the magnetic characteristics at the predetermined position when determining a state.

7. A state determination device for a hub unit bearing comprising:

an acquisition unit configured to acquire measurement information, of the magnetic characteristics in the vicinity of a flange portion of the hub unit bearing during a predetermined rotation operation, by communicating with a magnetic sensor that is of the hub unit bearing and is configured to detect the magnetic characteristics;

a derivation unit configured to derive a difference between a maximum value and a minimum value in the measurement information acquired by the acquisition unit; and a determination unit configured to determine a state of the hub unit bearing based on the difference derived by the derivation unit, wherein a predetermined position is the position at which the magnetic characteristics vary with the stress change with respect to the flange portion.

8. The state determination device according to claim 7, wherein the predetermined rotation operation is an operation corresponding to one rotation of the hub unit bearing.

9. The state determination device according to claim 7, wherein the magnetic characteristic is a magnetic flux density, and the measurement information includes information on magnetic flux density in three axial directions.

10. The state determination device according to claim 9, wherein the determination unit determines that, when the difference in at least one of the three axial directions exceeds a first threshold value in the difference derived by the derivation unit, the hub unit bearing is in a first state indicating that a timing at which replacement of the hub unit bearing is required is approaching, and determines that, when the difference in at least one of the three axial directions exceeds a second threshold value larger than the first threshold value in the change amount derived by the derivation unit, the hub unit bearing is in a second state in which a degree of urgency of replacement of the hub unit bearing is higher than that in the first state.

11. A state determination method for a hub unit bearing comprising:

acquiring measurement information, of magnetic characteristics at a predetermined position in the vicinity of a flange portion included in the hub unit bearing, by communicating with a magnetic sensor that is of the hub unit bearing and is configured to detect the magnetic characteristics;

deriving a change amount between reference information of the magnetic characteristic at the predetermined position in the vicinity of the flange portion and the measurement information acquired in the acquiring; and determining the state of the hub unit bearing based on the difference derived in the deriving, wherein the predetermined position is the position at which the magnetic characteristics vary with the stress change with respect to the flange portion, the magnetic characteristics comprise a magnetic flux density, and the reference information and the measurement information include information in three axial directions of the magnetic flux density.

12. A state determination method for a hub unit bearing comprising:

acquiring measurement information, of magnetic characteristics in the vicinity of a flange portion of the hub unit bearing, by communicating with a magnetic sensor that is of the hub unit bearing and is configured to detect the magnetic characteristics during a predetermined rotation operation;

deriving a difference between a maximum value and a minimum value in the measurement information acquired in the acquiring; and determining the state of the hub unit bearing based on the difference derived in the deriving, wherein a predetermined position is a position at which the magnetic characteristics vary with the stress change with respect to the flange portion.

13. A non-transitory computer-readable medium storing a program which causes a computer to function as:

a holding unit configured to hold reference information, of magnetic characteristics at a predetermined position in the vicinity of a flange portion included in the hub unit bearing, by communicating with a magnetic sensor that is of the hub unit bearing and is configured to detect the magnetic characteristics;

an acquisition unit configured to acquire measurement information of the magnetic characteristics at the predetermined position of the hub unit bearing;

a derivation unit configured to derive a change amount between the reference information held by the holding unit and the measurement information acquired by the acquisition unit; and a determination unit configured to determine a state of the hub unit bearing based on the change amount derived by the derivation unit, wherein the predetermined position is the position at which the magnetic characteristics vary with the stress change with respect to the flange portion, the magnetic characteristics comprise a magnetic flux density, and the reference information and the measurement information include information in three axial directions of the magnetic flux density.

14. A non-transitory computer-readable medium storing a program which causes a computer to function as:
- an acquisition unit configured to acquire measurement information, of magnetic characteristics in the vicinity of a flange portion of a hub unit bearing during a predetermined rotation operation, by communicating with a magnetic sensor that is of the hub unit bearing and is configured to detect the magnetic characteristics;
- a derivation unit configured to derive a difference between a maximum value and a minimum value in the measurement information acquired by the acquisition unit; and
- a determination unit configured to determine a state of the hub unit bearing based on the difference derived by the derivation unit,
- wherein a predetermined position is the position at which the magnetic characteristics vary with the stress change with respect to the flange portion.

15. A hub unit bearing comprising:
an outer ring having an outer ring raceway on an inner peripheral surface thereof; a hub having an inner ring raceway on an outer peripheral surface thereof, the inner ring raceway facing the outer ring raceway of the outer ring; and a plurality of rolling elements rollably provided between the outer ring raceway and the inner ring raceway, the hub unit bearing further comprising:
a magnetic sensor configured to detect magnetic characteristics in the vicinity of a flange portion provided in the hub unit bearing,
wherein a detection position detected by the magnetic sensor is a position at which the magnetic characteristics vary with the stress change with respect to the flange portion,
the magnetic characteristics comprise a magnetic flux density, and
the reference information and the measurement information include information in three axial directions of the magnetic flux density.

16. The hub unit bearing according to claim 15,
wherein the detection position is a radially outer end portion of the outer ring in the vicinity of the flange portion.

17. The hub unit bearing according to claim 15,
wherein the detection position is a cavity portion of the hub in the vicinity of the flange portion.

18. The hub unit bearing according to claim 15,
wherein a plurality of the magnetic sensors are provided.

19. The hub unit bearing according to claim 15,
wherein a state of the hub unit bearing is determined based on a difference between a detection result detected by the magnetic sensor and reference information set in advance.

\* \* \* \* \*